United States Patent
Yamazaki et al.

(10) Patent No.: US 12,319,513 B2
(45) Date of Patent: Jun. 3, 2025

(54) BULK FEEDER AND COMPONENT MOUNTING MACHINE

(71) Applicant: FUJI CORPORATION, Chiryu (JP)

(72) Inventors: Yusuke Yamazaki, Chiryu (JP); Yuji Kawasaki, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 78 days.

(21) Appl. No.: 18/262,502

(22) PCT Filed: Jan. 29, 2021

(86) PCT No.: PCT/JP2021/003420
§ 371 (c)(1),
(2) Date: Jul. 21, 2023

(87) PCT Pub. No.: WO2022/162915
PCT Pub. Date: Aug. 4, 2022

(65) Prior Publication Data
US 2024/0076136 A1   Mar. 7, 2024

(51) Int. Cl.
*B65G 47/14* (2006.01)
*B23P 19/00* (2006.01)
*H05K 13/02* (2006.01)
*H05K 13/08* (2006.01)

(52) U.S. Cl.
CPC .......... *B65G 47/145* (2013.01); *B23P 19/001* (2013.01); *H05K 13/02* (2013.01); *H05K 13/081* (2018.08)

(58) Field of Classification Search
None
See application file for complete search history.

(56) References Cited

U.S. PATENT DOCUMENTS

| | | | | |
|---|---|---|---|---|
| 2,798,935 A | * | 7/1957 | Kipp | H01H 11/043 219/79 |
| 2,814,379 A | * | 11/1957 | Sernetz | B65G 27/30 198/753 |
| 3,080,961 A | * | 3/1963 | Allen | B65G 27/16 198/761 |
| 4,387,506 A | * | 6/1983 | Wright | H05K 13/0434 221/293 |

(Continued)

FOREIGN PATENT DOCUMENTS

| | | |
|---|---|---|
| EP | 0 116 922 A1 | 8/1984 |
| JP | 7-157055 A | 6/1995 |
| JP | 2011-114084 A | 6/2011 |

*Primary Examiner* — Joseph A Dillon, Jr.
(74) *Attorney, Agent, or Firm* — Oblon, McClelland, Maier & Neustadt, L.L.P.

(57) ABSTRACT

A bulk feeder includes a feeder main body, a track member provided to be vibratable with respect to the feeder main body and formed with a conveyance path through which multiple components are conveyed and a supply region that communicates with the conveyance path and opens upward to collect the multiple components, an excitation device configured to apply vibration to the track member so that the multiple components are conveyed along the conveyance path, a shutter provided above the track member to close an opening of the supply region, and a driving device configured to open or close the shutter to separate the shutter from the track member when the shutter shifts from a closed state to an open state.

9 Claims, 5 Drawing Sheets

(56) References Cited

U.S. PATENT DOCUMENTS

| | | | | |
|---|---|---|---|---|
| 4,601,382 A * | 7/1986 | Roberts | H05K 13/028 | 198/755 |
| 4,809,839 A * | 3/1989 | Elliott | H05K 13/02 | 198/456 |
| 4,927,001 A * | 5/1990 | Hendricks | B65G 47/1421 | 198/771 |
| 5,084,959 A * | 2/1992 | Ando | H05K 13/0813 | 29/846 |
| 5,154,316 A * | 10/1992 | Holcomb | H05K 13/028 | 414/415 |
| 5,314,055 A * | 5/1994 | Gordon | G05B 19/4182 | 198/395 |
| 5,651,176 A * | 7/1997 | Ma | H05K 13/043 | 29/823 |
| 5,687,831 A * | 11/1997 | Carlisle | H05K 13/022 | 198/395 |
| 5,860,505 A * | 1/1999 | Metzger | B65G 47/8823 | 198/463.6 |
| 6,062,797 A * | 5/2000 | Gaines | B65G 27/08 | 414/415 |
| 6,116,822 A * | 9/2000 | Teoh | B65G 47/1407 | 406/122 |
| 6,116,840 A * | 9/2000 | Saito | B23P 19/004 | 221/292 |
| 6,195,876 B1 * | 3/2001 | Koyama | H05K 13/043 | 29/33 J |
| 6,210,080 B1 * | 4/2001 | Haul | B65G 51/02 | 406/84 |
| 6,210,081 B1 * | 4/2001 | Saho | B23P 19/004 | 406/75 |
| 6,250,455 B1 * | 6/2001 | Saito | H05K 13/022 | 198/396 |
| 6,318,541 B1 * | 11/2001 | Takahashi | B65G 25/06 | 198/750.1 |
| 6,318,592 B1 * | 11/2001 | Takahashi | B65G 25/06 | 221/268 |
| 6,443,669 B2 * | 9/2002 | Saito | H05K 13/021 | 406/28 |
| 6,877,294 B2 * | 4/2005 | Hellmann | B65B 5/105 | 53/446 |
| 6,932,544 B2 * | 8/2005 | McMahon | A44B 19/267 | 406/176 |
| 6,991,091 B2 * | 1/2006 | Thomson | B65G 27/32 | 198/759 |
| 7,104,394 B2 * | 9/2006 | Baird | B65G 27/24 | 198/769 |
| 7,222,750 B2 * | 5/2007 | Mosca | G01G 13/28 | 198/758 |
| 7,284,934 B2 * | 10/2007 | Hoogers | H05K 13/027 | 406/137 |
| 7,472,787 B2 * | 1/2009 | Uusitalo | B65G 51/02 | 198/395 |
| 7,857,123 B2 * | 12/2010 | Fuyama | B65G 27/32 | 198/758 |
| 8,573,382 B2 * | 11/2013 | Bastasch | B65G 47/24 | 198/398 |
| 8,584,830 B2 * | 11/2013 | Heigl | H05K 13/021 | 198/750.12 |
| 8,960,414 B2 * | 2/2015 | Bassani | B65G 27/08 | 198/758 |
| 9,051,133 B2 * | 6/2015 | Kremser | B21J 15/323 | |
| 9,745,138 B2 * | 8/2017 | Kimura | B06B 1/0603 | |
| 9,840,376 B2 * | 12/2017 | White | B65G 51/01 | |
| 9,850,074 B2 * | 12/2017 | Yip | B65G 25/04 | |
| 9,949,417 B2 * | 4/2018 | Morikawa | B23P 19/001 | |
| 10,087,016 B2 * | 10/2018 | Nakajima | H05K 13/02 | |
| 10,150,624 B2 * | 12/2018 | Doudement | B65G 47/1464 | |
| 10,299,418 B2 * | 5/2019 | Muratsuchi | H05K 13/0408 | |
| 11,358,801 B2 * | 6/2022 | Svejkovsky | B65G 27/32 | |
| 11,820,602 B2 * | 11/2023 | Ludescher | B65G 27/26 | |
| 12,035,479 B2 * | 7/2024 | Yamazaki | H05K 13/043 | |
| 12,114,431 B2 * | 10/2024 | Fujie | H05K 13/028 | |
| 2006/0131995 A1 | 6/2006 | Narukawa | B65G 27/24 | 310/323.01 |
| 2008/0217136 A1 * | 9/2008 | Ikeda | H01G 13/00 | 198/380 |
| 2013/0042943 A1 * | 2/2013 | Bassani | B65B 57/20 | 700/242 |
| 2015/0056053 A1 * | 2/2015 | Sano | H05K 13/028 | 414/755 |
| 2019/0276173 A1 * | 9/2019 | Takeuchi | H01L 21/67333 | |
| 2021/0237984 A1 * | 8/2021 | Berger | B65G 47/20 | |
| 2022/0400588 A1 * | 12/2022 | Kotani | H05K 13/0812 | |
| 2022/0400589 A1 * | 12/2022 | Kawasaki | H05K 13/0813 | |
| 2022/0408619 A1 * | 12/2022 | Yamazaki | B65G 47/14 | |
| 2024/0067453 A1 * | 2/2024 | Yamazaki | B65G 43/02 | |
| 2024/0076133 A1 * | 3/2024 | Yamazaki | B65G 27/16 | |
| 2024/0076134 A1 * | 3/2024 | Yamazaki | B65G 47/16 | |
| 2024/0076137 A1 * | 3/2024 | Tanizawa | B65G 45/105 | |
| 2024/0083692 A1 * | 3/2024 | Kawasaki | B65G 47/14 | |
| 2024/0134352 A1 * | 4/2024 | Yamazaki | H05K 13/0895 | |
| 2024/0165727 A1 * | 5/2024 | Kawasaki | H05K 13/028 | |
| 2024/0231323 A9 * | 7/2024 | Yamazaki | H05K 13/028 | |

* cited by examiner

| PERIOD | • CALIBRATION<br>• POWER OFF<br>• MOUNTING OPERATION (NO CONVEYANCE IS REQUIRED) | • COMPONENT CONVEYANCE (ACCOMMODATED IN CAVITY)<br>• MOUNTING OPERATION (CONVEYANCE IS REQUIRED) | • RECOGNITION PROCESSING<br>• COLLECTION OPERATION |
|---|---|---|---|
| SHUTTER | CLOSED STATE | INTERMEDIATE STATE | OPEN STATE |
| MOTOR | OFF | ON | ON |
| OPENING/ CLOSING SENSOR | OFF | OFF | ON |

BULK FEEDER AND COMPONENT MOUNTING MACHINE

TECHNICAL FIELD

The present disclosure relates to a bulk feeder and a component mounting machine.

BACKGROUND ART

A bulk feeder is provided in a component mounting machine for mounting a component on a substrate, and is used for supplying the component in a bulk state. The bulk feeder conveys multiple components discharged from a component case, and supplies the components in a supply region opened upward so that a suction nozzle can collect the components. Patent Literature 1 discloses a configuration for applying vibration to a conveyance path to convey multiple components.

PATENT LITERATURE

Patent Literature 1: JP-A-2011-114084

BRIEF SUMMARY

Technical Problem

There is a demand for such a bulk feeder to prevent a component from protruding from a supply region during conveyance of the component or the like, and to prevent foreign matters from entering the supply region. Therefore, it is assumed to provide a shutter that is provided to be openable or closable above the supply region and closes an opening of the supply region in a closed state. However, when the shutter affects the vibration characteristics during conveyance of the component using vibration, there is a concern that conveyance efficiency of the component may be reduced.

An object of the present specification is to provide a bulk feeder and a component mounting machine capable of preventing a component from protruding from a supply region and appropriately performing a conveying operation of the component using vibration.

Solution to Problem

According to the present specification, there is provided a bulk feeder including: a feeder main body; a track member provided to be vibratable with respect to the feeder main body and formed with a conveyance path through which multiple components are conveyed and a supply region that communicates with the conveyance path and opens upward to collect the multiple components; an excitation device configured to apply vibration to the track member so that the multiple components are conveyed along the conveyance path; a shutter provided above the track member to close an opening of the supply region; and a driving device configured to open or close the shutter to separate the shutter from the track member when the shutter shifts from a closed state to an open state.

Advantageous Effects

With such a configuration, since an opening of a supply region can be closed by bringing a shutter into a closed state, a bulk feeder can prevent a component from protruding during conveyance and prevent foreign matters from entering the supply region. In addition, since the shutter shifting from a closed state to an open state is separated from a track member in which the supply region is formed, it is possible to prevent the shutter from affecting vibration characteristics of the track member. Accordingly, the bulk feeder can appropriately perform a conveying operation of the component using the vibration by releasing the closed state of the shutter.

BRIEF DESCRIPTION OF DRAWINGS

FIG. 7 is a side view illustrating an enlarged intermediate state of the shutter.
FIG. 8 is a table illustrating a relationship between each period and a state of the shutter or the like in mounting process or the like.

DESCRIPTION OF EMBODIMENTS

1. Configuration of Component Mounting Machine 10

Component mounting machine 10 makes up a production line for producing a substrate product together with multiple types of substrate working machines including, for example, another component mounting machine 10. The substrate working machine making up the production line described above can include a printer, an inspection device, a reflow furnace, and the like.

1-1. Substrate Conveyance Device

Figure 1:
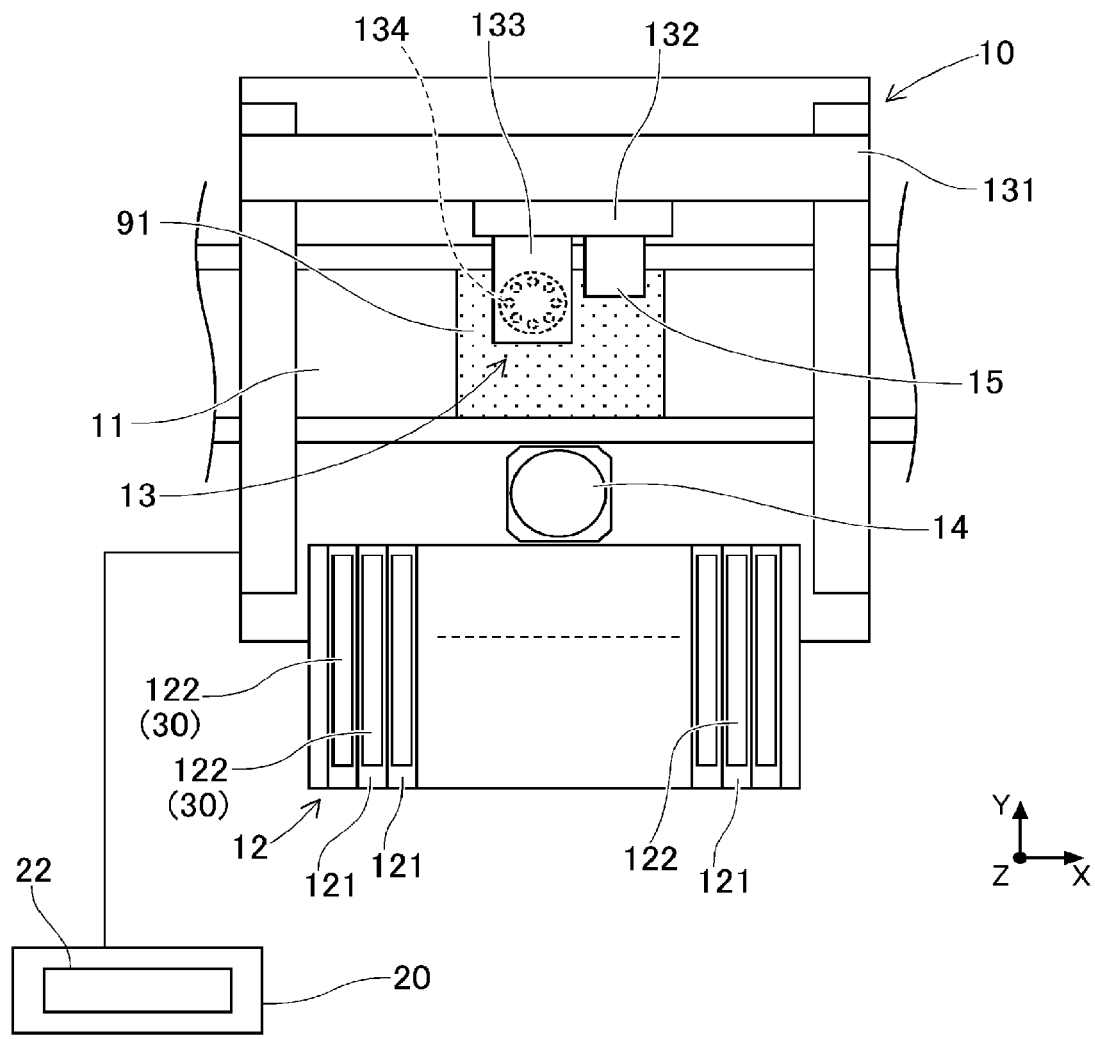
FIG. 1 is a plan view schematically illustrating a component mounting machine provided with a bulk feeder.

As illustrated in FIG. 1, component mounting machine 10 includes substrate conveyance device 11. Substrate conveyance device 11 subsequently conveys substrate 91 in a conveyance direction and positions substrate 91 in a predetermined position in component mounting machine 10.

1-2. Component Supply Device 12

Component mounting machine 10 includes component supply device 12. Component supply device 12 supplies components to be mounted on substrate 91. Component supply device 12 includes feeders 122 which are provided individually in multiple slots 121. A tape feeder, which is configured to feed and move a carrier tape housing, for example, a number of components so as to supply the components to be collected, is applied to feeder 122. In addition, bulk feeder 30 that supplies a component accommodated in a bulk state (a state in which each posture is irregular) so as to be collectable is applied to feeder 122. Details of bulk feeder 30 will be described later.

1-3. Component Transfer Device 13

Component mounting machine 10 includes component transfer device 13. Component transfer device 13 transfers the component supplied by component supply device 12 onto a predetermined mounting position on substrate 91. Component transfer device 13 includes head driving device 131, moving body 132, mounting head 133, and suction nozzles 134. Head driving device 131 moves moving body 132 in a horizontal direction (an X-direction and a Y-direction) by a linear motion mechanism. Mounting head 133 is detachably fixed to moving body 132 by a clamp member, not illustrated, and is provided to be movable in the horizontal directions within the mounting machine.

Figure 3:
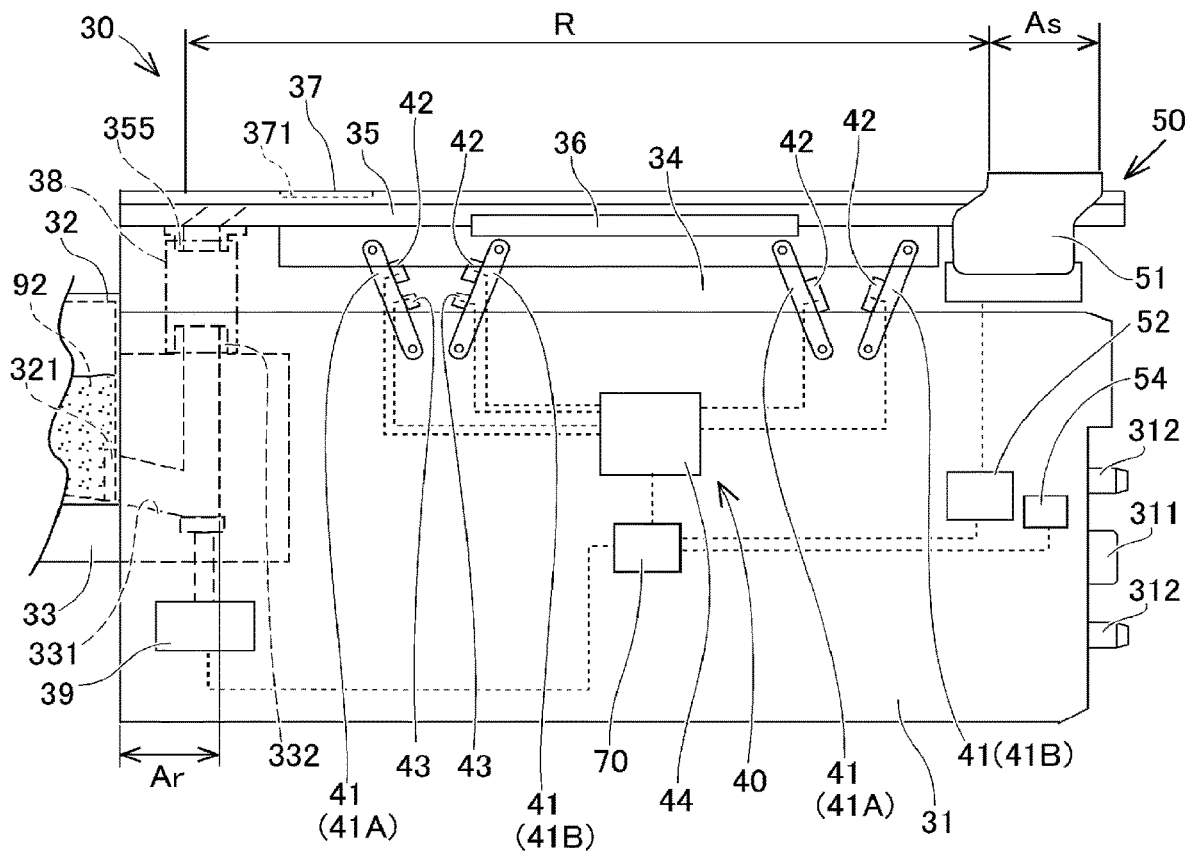
FIG. 3 is a side view schematically illustrating a main part of a bulk feeder.

Mounting head 133 supports multiple suction nozzles 134 in such a manner as to be rotated, and raised and lowered. Suction nozzle 134 is a holding member that collects and holds component 92 (see FIG. 3) supplied by feeder 122. Suction nozzle 134 picks up the component supplied by feeder 122 by supplied negative pressure air. As a holding member to be attached to mounting head 133, a chuck or the like can be adopted which holds the component by gripping the component.

1-4. Part Camera 14 and Substrate Camera 15

Component mounting machine 10 includes part camera 14 and substrate camera 15. Part camera 14 and substrate camera 15 are digital imaging devices having an imaging element, such as CMOS. Part camera 14 and substrate camera 15 execute imaging based on control signals and send out image data acquired through the imaging. Part camera 14 is configured to image the component held by suction nozzle 134 from below. Substrate camera 15 is provided on moving body 132 in such a manner as to be movable in the horizontal direction together with mounting head 133. Substrate camera 15 is configured to image substrate 91 from above.

Figure 4:
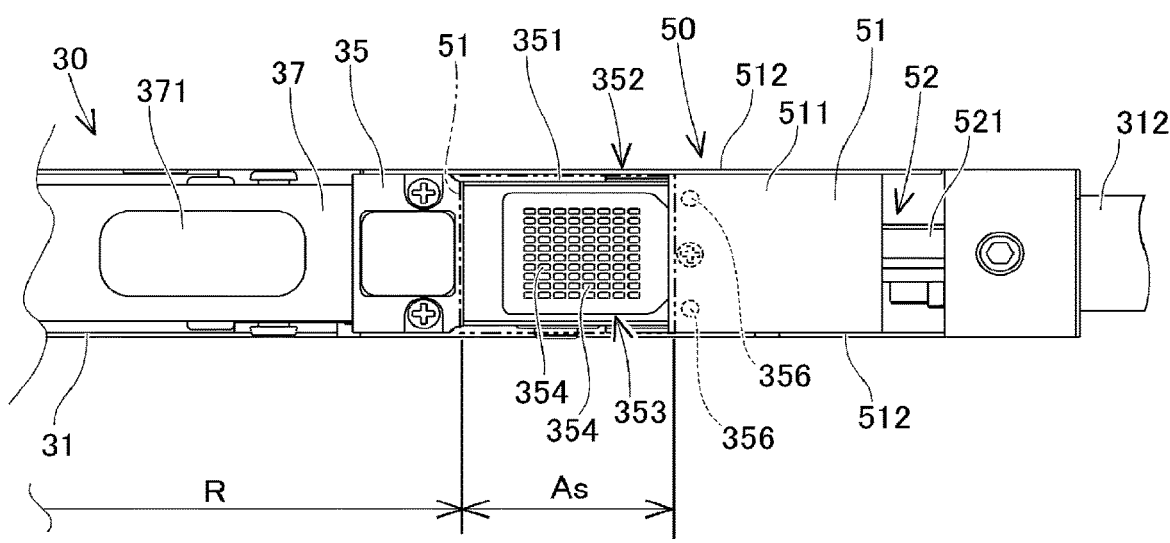
FIG. 4 is a plan view as viewed from an IV direction in FIG. 2.

Substrate camera 15 can image a front surface of substrate 91 as an imaging target and can also image various types of devices additionally as imaging targets as long as those devices fall within the movable range of moving body 132. For example, in the present embodiment, as illustrated in FIG. 4, substrate camera 15 can image supply region As to which bulk feeder 30 supplies component 92 or reference mark 356 provided on the upper portion of bulk feeder 30 in a visual field of the camera. Thus, as described above, substrate camera 15 can be used commonly to image different imaging targets in order to acquire image data for use in various image processing.

1-5. Control Device 20

As illustrated in FIG. 1, component mounting machine 10 includes control device 20. Control device 20 mainly includes a CPU, various memories, a control circuit, and a storage device. Control device 20 stores various data such as a control program used for controlling a mounting process in control device 20. The control program denotes mounting positions, mounting angles, and a mounting order of components which are mounted on substrate 91 in the mounting process.

Control device 20 executes recognition processing of a holding state of the component held by each of multiple holding members (suction nozzles 134). Specifically, control device 20 executes image processing on the image data acquired by the imaging of part camera 14 and recognizes a position and an angle of each component with respect to a reference position of mounting head 133. It should be noted that, in addition to part camera 14, for example, control device 20 may execute the image processing on image data acquired by imaging the component by a head camera unit or the like provided integrally with mounting head 133 from side, below, or above.

Control device 20 controls a mounting operation of the component by mounting head 133 based on the control program to execute the mounting process. Here, the mounting process includes a process of repeating a PP cycle (a pick-and-place cycle) including a collection operation and a mounting operation multiple times. The "collection operation" described above is an operation in which the component supplied by component supply device 12 is collected by suction nozzle 134.

In the present embodiment, control device 20 controls the operation of component supply device 12 including bulk feeder 30 when executing the above-described collection operation. The control targeted for the operation of bulk feeder 30 includes, for example, the supply operation of component 92 by bulk feeder 30, and the control of an opening/closing operation of shutter 51 described later.

Control device 20 includes state recognition section 22. State recognition section 22 recognizes the supply states of multiple components 92 in supply region As of bulk feeder 30 based on the image data acquired by the imaging of the camera (in the present embodiment, substrate camera 15). The processing for recognizing the supply state includes processing for recognizing whether there is component 92 that can be collected in supply region As, and when there is component 92 that can be collected, recognizing the position and the angle of component 92. Moreover, control device 20 controls an operation of mounting head 133 in the collection operation based on a result of the recognition processing of the supply state.

In addition, the "mounting operation" described above is an operation of mounting the collected component at a predetermined mounting angle in a predetermined mounting position on substrate 91. In the mounting process, control device 20 controls the operation of mounting head 133 based on information output from various sensors, the result of image processing, a control program, or the like. As a result, the positions and angles of multiple suction nozzles 134 supported by mounting head 133 are controlled.

2. Configuration of Bulk Feeder 30

Bulk feeder 30 is provided on component mounting machine 10 and functions as a part of component supply device 12. Bulk feeder 30 supplies component 92 accommodated in a bulk state that is not aligned like a carrier tape. Therefore, since bulk feeder 30 does not use a carrier tape unlike the tape feeder, it has a merit in that loading of the carrier tape, collection of the used tape, or the like can be omitted.

Bulk feeder 30 is, for example, of a type that supplies component 92 in an irregular posture to a planar supply region As. However, when components 92 are so close to each other or deposited (in a state overlapping in the up-down direction) that components 92 are in contact with each other in supply region As, or when component 92 are in a horizontal posture and a width direction of components 92 is in an up-down direction, such a component cannot be the collection target. Accordingly, in order to increase an amount of components 92 which can be collected, there is a type of bulk feeder 30 that supplies components 92 in an aligned state in supply region As. In the present embodiment, bulk feeder 30 of the type in which components 92 are aligned will be exemplified.

2-1. Feeder Main Body 31

Figure 2:
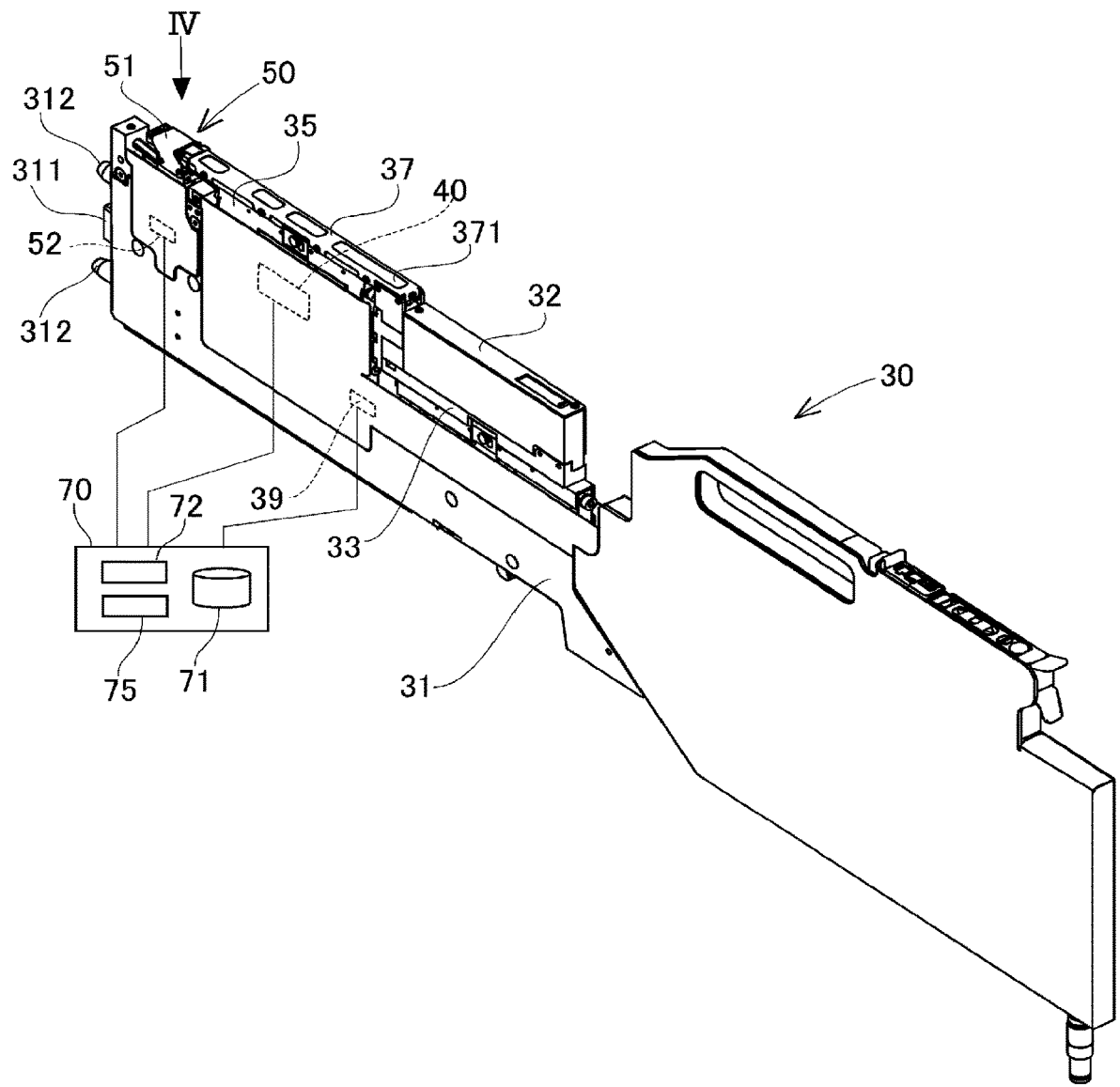
FIG. 2 is a perspective view illustrating an appearance of the bulk feeder.

As illustrated in FIG. 2, bulk feeder 30 includes feeder main body 31 formed in a flat box shape. Connector 311 and two pins 312 are provided at a front portion of feeder main body 31. When feeder main body 31 is set in slot 121 of component supply device 12, power is supplied via connector 311 and communication with control device 20 is enabled. Two pins 312 are inserted into guide holes provided in slot 121, and are used for positioning when feeder main body 31 is set in slot 121.

2-2. Component Case 32 and Receiving Member 33

Component case 32 for accommodating multiple components 92 in a bulk state is detachably attached to feeder main body 31 via receiving member 33. Component case 32 is an external device of bulk feeder 30. One suitable for the mounting process is selected from various types of component cases 32 and attached to feeder main body 31. Discharge port 321 through which component 92 is discharged to the outside is formed in a front portion of component case 32.

Receiving member 33 is provided to be vibratable with respect to feeder main body 31, and supports attached component case 32. Receiving member 33 is formed with receiving region Ar for receiving component 92 discharged from component case 32. In the present embodiment, receiving member 33 has inclined portion 331 inclined toward the front side with respect to a horizontal plane in receiving region Ar. Inclined portion 331 is located below discharge port 321 of component case 32 and has a planar shape. Receiving member 33 is formed with a flow path of component 92 extending above receiving region Ar, and feed-out section 332 through which the flow path opens upward is formed.

2-3. Bracket 34, Track Member 35, and Lock Unit 36

Bulk feeder 30 includes bracket 34 and track member 35. Bracket 34 is provided to be vibratable with respect to feeder main body 31. Bracket 34 is formed in a block shape extending in a front-rear direction of feeder main body 31, and track member 35 is attached to an upper surface of bracket 34. Bracket 34 is supported by support member 41 of excitation device 40 described later. Track member 35 is formed with conveyance path R through which multiple components 92 are conveyed, and supply region As that communicates with conveyance path R and opens upward so as to be able to collect multiple components 92.

Bulk feeder 30 includes lock unit 36. Lock unit 36 locks track member 35 in a state in which track member 35 is attached to bracket 34. When track member 35 is locked by lock unit 36, track member 35 vibrates integrally with bracket 34 with respect to feeder main body 31. Track member 35 is made detachable from bracket 34 by unlocking of lock unit 36.

2-4. Detailed Configuration of Track Member 35, Cover 37, and Connection Member 38

Track member 35 is formed so as to extend in the front-rear direction (left-right direction in FIG. 4) of feeder main body 31. Pair of side walls 351 protruding upward is formed on both edges of track member 35 in the width direction (the up-down direction in FIG. 4). Pair of side walls 351 surrounds a periphery of conveyance path R together with distal end portion 352 of track member 35, so as to prevent leakage of component 92 conveyed through conveyance path R. Circular reference mark 356 indicating a reference position of supply region As is affixed to an upper surface of distal end portion 352 in a pair in the left-right direction.

In the present embodiment, alignment member 353 is exchangeably attached to track member 35. Alignment member 353 has multiple cavities 354 that individually accommodate multiple components 92. Specifically, multiple cavities 354 are arranged in a matrix in supply region As. For example, alignment member 353 has a total of 80 cavities 354 that are regularly arranged 8 in the conveyance direction and 10 in the width direction of conveyance path R. Each of multiple cavities 354 opens upward to accommodate component 92 in a posture in which a thickness direction of component 92 is in the up-down direction.

The opening of cavity 354 is set to a dimension slightly larger than an outer shape of component 92 in an upward view. The depth of cavity 354 is set according to the type (shape, mass, or the like) of component 92. One selected from various types of track members 35 based on the type of component 92, the required number of cavities 354, and the functionality is attached.

Here, "supply region As" of track member 35 is a region for supplying component 92 in a bulk state, and is a region from which component 92 can be collected by suction nozzle 134 supported by mounting head 133. In addition, "conveyance path R" of track member 35 is a path of component 92 through which component 92 flowed from receiving region Ar to track member 35 is conveyed to supply region As.

Bulk feeder 30 includes cover 37. Cover 37 is fixed to track member 35 and covers an upper portion of conveyance path R. Cover 37 has multiple exhaust ports 371 formed on an upper surface thereof. A mesh having a joint smaller than an outer dimension of component 92 is stretched in exhaust port 371. With such a configuration, cover 37 is configured to be able to discharge air from exhaust port 371 to the outside while preventing component 92 from protruding from conveyance path R.

Track member 35 is formed with a flow path of component 92 extending downward at a rear portion thereof, and has introduction portion 355 through which the flow path opens downward. Introduction portion 355 faces feed-out section 332 of receiving member 33 in the up-down direction. Bulk feeder 30 includes tubular connection member 38. Connection member 38 connects feed-out section 332 of receiving member 33 and introduction portion 355 of track member 35. In the present embodiment, connection member 38 is a tight coil spring and has flexibility as a whole.

According to the configuration as described above, connection member 38 connects multiple components 92 so as to be able to flow between receiving region Ar and conveyance path R. In addition, connection member 38 absorbs the vibration by being deformed in accordance with the vibration of receiving member 33 and the vibration of track member 35 with respect to feeder main body 31. Connection member 38 alleviates or blocks vibration transmitted between receiving member 33 and track member 35 that vibrate independently of each other.

2-5. Air Supply Device 39

Bulk feeder 30 includes air supply device 39. Air supply device 39 supplies positive pressure air from a lower side of receiving region Ar, so that multiple components 92 are caused to flow from receiving member 33 to track member 35 via connection member 38. In the present embodiment, air supply device 39 supplies or blocks the positive pressure air supplied from the outside from a lower side of receiving region Ar based on a command from feeder control device 70 described later.

When air supply device 39 supplies the positive pressure air, multiple components 92 staying in receiving region Ar are blown upward by the positive pressure air. The positive pressure air and multiple components 92 flow in this order through feed-out section 332 of receiving member 33, connection member 38, and introduction portion 355, and reach conveyance path R of track member 35. Here, the positive pressure air is exhausted to the outside from exhaust port 371 of cover 37. In addition, multiple components 92 fall into conveyance path R of track member 35 by their own weight.

2-6. Excitation Device 40

Bulk feeder 30 includes excitation device 40 provided in feeder main body 31. Excitation device 40 applies vibration to track member 35 so that multiple components 92 are conveyed along conveyance path R. Specifically, excitation device 40 includes multiple support members 41, multiple piezoelectric elements 42, vibration sensor 43, and power supply device 44. Multiple support members 41 directly or indirectly connect feeder main body 31 and bracket 34 to support bracket 34.

In the present embodiment, multiple support members 41 include forward movement support member 41A used for forward conveyance of component 92 and rearward movement support member 41B used for rearward conveyance. The inclination directions of forward movement support member 41A and rearward movement support member 41B with respect to the vertical direction are different from each other. Multiple piezoelectric elements 42 are vibrators that vibrate at a frequency corresponding to power supplied from power supply device 44. Multiple piezoelectric elements 42 are attached to multiple support members 41, respectively.

When at least some of multiple piezoelectric elements 42 vibrate, vibration is applied to track member 35 via bracket 34. In addition, the amplitude of track member 35 changes in accordance with the voltage applied to piezoelectric element 42. Vibration sensor 43 detects the frequency or amplitude of the actual vibration of track member 35 when piezoelectric element 42 is supplied with power and vibrated. In the present embodiment, vibration sensor 43 is provided in multiple support members 41 that support bracket 34 that vibrates integrally with track member 35.

Here, when excitation device 40 applies vibration to track member 35, track member 35 performs an elliptical motion in the side view. As a result, an external force of a front side and an upper side, or an external force of a rear side and an upper side is applied to multiple components 92 in conveyance path R according to the rotational direction of the elliptical motion of track member 35. As a result, multiple components 92 are conveyed to the front side or the rear side of track member 35.

Power supply device 44 changes the frequency and the applied voltage of the power supplied to piezoelectric element 42 based on a command of feeder control device 70 described later. As a result, the frequency and the amplitude of the vibration applied to track member 35 are adjusted, so that the rotational direction of the elliptical motion of track member 35 is determined. When the frequency or amplitude of the vibration of track member 35 and the rotational direction of the elliptical motion caused by the vibration change, a conveyance speed of component 92 to be conveyed, a degree of dispersion of component 92, a conveyance direction, and the like change.

Therefore, in order to improve conveyance efficiency, excitation device 40 sets in advance power supply (frequency, applied voltage) corresponding to vibration characteristics (including the natural frequency) having individual differences. For example, bulk feeder 30 executes the calibration processing in a state in which track member 35 used for a supply operation to be executed is attached, that is, in a state in which track member 35 is locked by lock unit 36 with respect to bracket 34.

In this calibration processing, first, at least one of the frequency and the amplitude of the actual vibration of track member 35 is measured based on the value detected by vibration sensor 43. Then, in the calibration processing, the power to piezoelectric element 42 by power supply device 44 is adjusted based on the measurement result regarding the vibration. The calibration processing is repeated to acquire power supplied to piezoelectric element 42 when bracket 34 and track member 35 integrally vibrate at the natural frequency.

3. Shutter Unit 50

Bulk feeder 30 configured as described above moves multiple components 92 discharged from component case 32 from receiving region Ar to supply region As via conveyance path R. At this time, cover 37 is provided above conveyance path R as described above, so that component 92 is prevented from protruding. Meanwhile, it is preferable to close the opening of supply region As in supply region As when component 92 is conveyed, for example, while enabling the collection of component 92 by suction nozzle 134.

Therefore, bulk feeder 30 includes shutter unit 50 capable of opening or closing the opening of supply region As. Shutter unit 50 includes shutter 51 provided above track member 35 and capable of closing the opening of supply region As. As a result, by opening or closing shutter 51, it is possible to prevent component 92 from protruding and foreign matters from entering supply region As.

However, since component 92 supplied by bulk feeder 30 is very fine depending on the type, it is desirable that shutter 51 and track member 35 are in close contact with each other so that a gap is not formed between shutter 51 and track member 35 in a case where shutter 51 is in the closed state. However, in a case where bulk feeder 30 is a type using vibration for conveying component 92 as in the present embodiment, when shutter 51 is in contact with track member 35, there is a concern that the contact may be the resistance of the vibration of track member 35 or may affect the vibration characteristic of track member 35.

Figure 5:
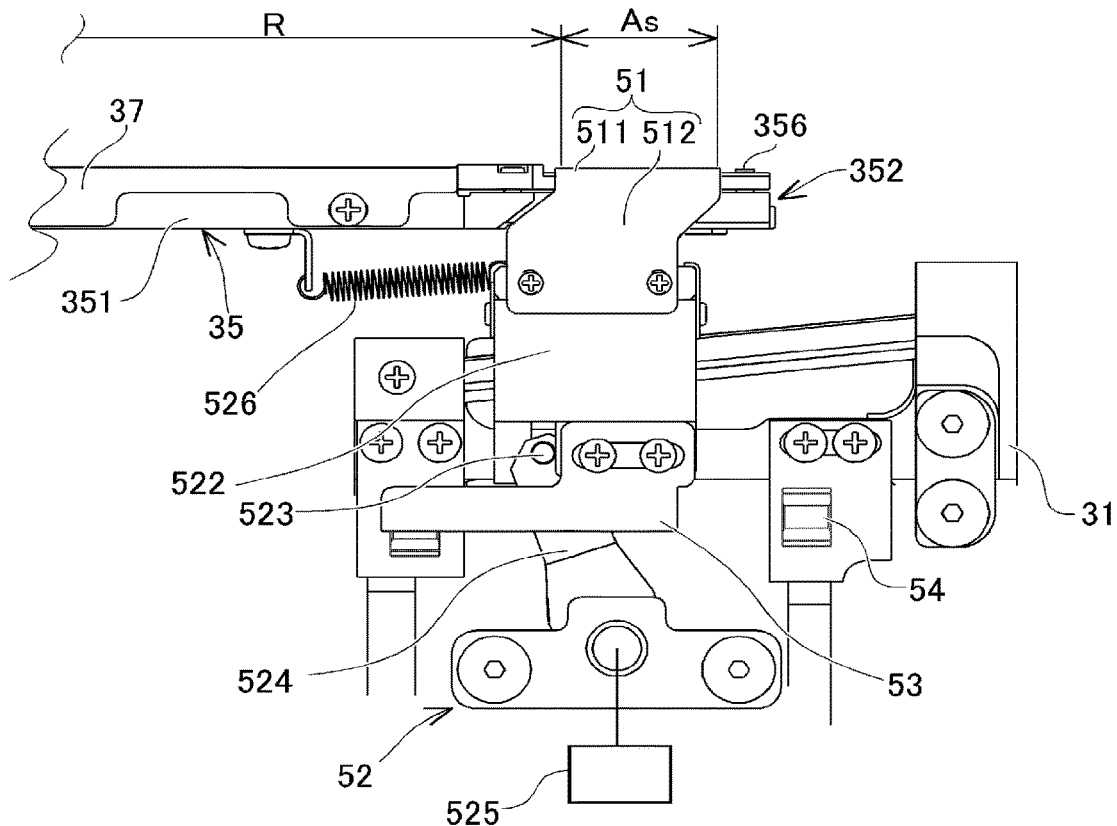
FIG. 5 is a side view illustrating a closed state of a shutter.

Therefore, bulk feeder 30 of the present embodiment adopts a configuration that can prevent component 92 from protruding from supply region As and can appropriately perform the conveying operation of component 92 using the vibration. Specifically, shutter unit 50 of bulk feeder 30 includes shutter 51 and driving device 52, as illustrated in FIG. 5. In addition, it is preferable that shutter unit 50 further includes dock 53 and opening/closing sensor 54.

3-1. Shutter 51

Shutter 51 is configured to be able to close the opening of supply region As described above. Here, shutter 51 is switched between an open state and a closed state by an opening/closing operation. The closed state of shutter 51 is a state in which shutter 51 comes into contact with track member 35 and the opening of supply region As is completely closed. At this time, as indicated by dashed lines in FIG. 4, shutter 51 is located on the rear side of feeder main body 31 with respect to pair of reference marks 356 of track member 35, so that pair of reference marks 356 can be visually recognized and imaged in the upward view. It should be noted that FIG. 4 illustrates shutter 51 in the closed state with two-dot chain lines (the same applies to FIGS. 6 and 7).

In addition, the open state of shutter 51 is a state in which the opening of supply region As is not closed and a principal range (range where multiple cavities 354 are provided in the present embodiment) of supply region As is exposed. At this time, suction nozzle 134 can execute the collection operation of component 92 on any of the cavities 354.

Further, in the present embodiment, the opening/closing operation of shutter 51 includes an intermediate state which is a state between the closed state and the open state, in which shutter 51 is separated from track member 35 by the amplitude of track member 35 that vibrates at least by the excitation of excitation device 40, and restricts the protruding of component 92 from the opening of supply region As.

Shutter 51 is formed in a U-shape that opens downward when viewed in the front-rear direction as a whole. In the present embodiment, as illustrated in FIG. 5, shutter 51 has an upper wall portion 511 and pair of side wall portions 512. Upper wall portion 511 is in contact with track member 35 in the closed state to close the opening of supply region As, and is separated from track member 35 in the intermediate state. Pair of side wall portions 512 is located outside track member 35 in the left-right direction and extends downward from both end edges of upper wall portion 511, thereby restricting the protrusion of component 92 from the opening of supply region As together with upper wall portion 511 in the intermediate state.

3-2. Driving Device 52

Driving device 52 opens or closes shutter 51 so as to separate shutter 51 from track member 35 when shutter 51 shifts from the closed state to the open state. Specifically, driving device 52 performs the opening/closing operation of shutter 51 with the following configuration. In the present embodiment, driving device 52 includes rail 521 and slider 522. As illustrated in FIG. 5, rail 521 extends in the front-rear direction and the up-down direction of feeder main body 31.

In the present embodiment, rails 521 are provided in a pair on both left and right sides of feeder main body 31. Rail 521 is formed in a straight line extending gradually upward from the rear side toward the front side. Slider 522 supports shutter 51. Slider 522 is fastened to pair of side wall portions 512 of shutter 51 by a bolt. Slider 522 is configured to be movable along rail 521.

When slider 522 moves in the front-rear direction along rail 521, shutter 51 moves in the front-rear direction integrally with slider 522. At this time, shutter 51 moves in the up-down direction in accordance with a movement amount in the front-rear direction by the inclination of rail 521. As driving device 52, various forms can be adopted as a mechanism for moving slider 522. In the present embodiment, driving device 52 includes pin 523, arm 524, motor 525, and spring 526 as in the present embodiment.

Pin 523 extends in the left-right direction (the front-rear direction in FIG. 5) of feeder main body 31 and locks slider 522 in the front-rear direction. In the present embodiment, pin 523 locks a rear end portion of slider 522. Arm 524 is provided so as to support pin 523 and to be rotatable about a horizontal axis extending in the left-right direction with respect to feeder main body 31. As a result, when arm 524 rotates, pin 523 moves on an arcuate track about a rotation axis of arm 524.

Motor 525 rotates arm 524. Motor 525 is supplied with power by feeder control device 70 described later. Motor 525 is configured to rotate arm 524 about the horizontal axis by a predetermined angle in accordance with the power supply. Spring 526 is an elastic member that connects feeder main body 31 and slider 522. In the present embodiment, spring 526 is a coil-shaped tension spring as an elastic member.

Spring 526 acts an elastic force so as to constantly bias slider 522 toward the rear side. At this time, since slider 522 is provided so as to move along the inclined rail 521, spring 526 biases slider 522 toward the lower end side of rail 521.

That is, according to the configuration as described above, when the power supply to motor 525 is interrupted, slider 522 is biased to the rear side by spring 526, so that shutter 51 is closed.

Figure 6:
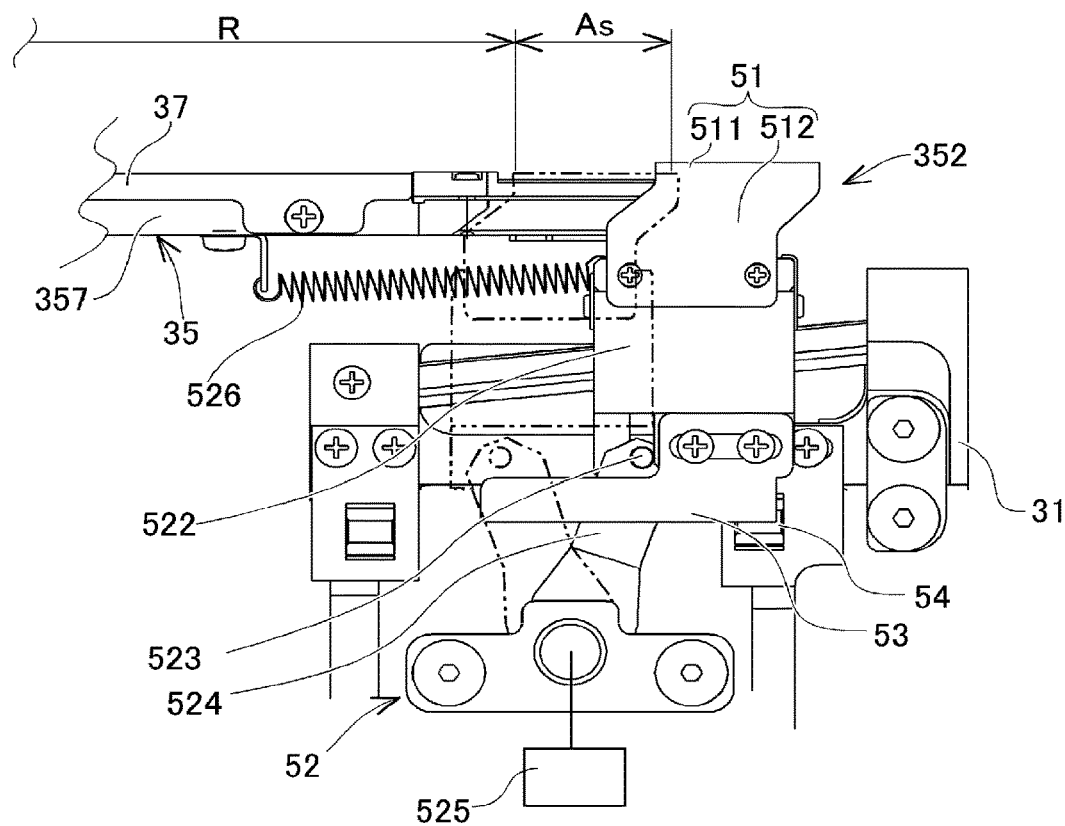
FIG. 6 is a side view illustrating an open state of the shutter.

When upper wall portion 511 of shutter 51 is in contact with the upper edge of track member 35, slider 522 stops at a rear end position (is a lower end position and an initial position of slider 522). When power is supplied to motor 525, as illustrated in FIG. 6, arm 524 rotates, and slider 522 moves to the front side along rail 521 against a biasing force of spring 526. As a result, shutter 51 supported by slider 522 moves to the front side and is brought into the open state. At this time, shutter 51 moves upward by the inclination amount of rail 521.

Figures 7, 8:
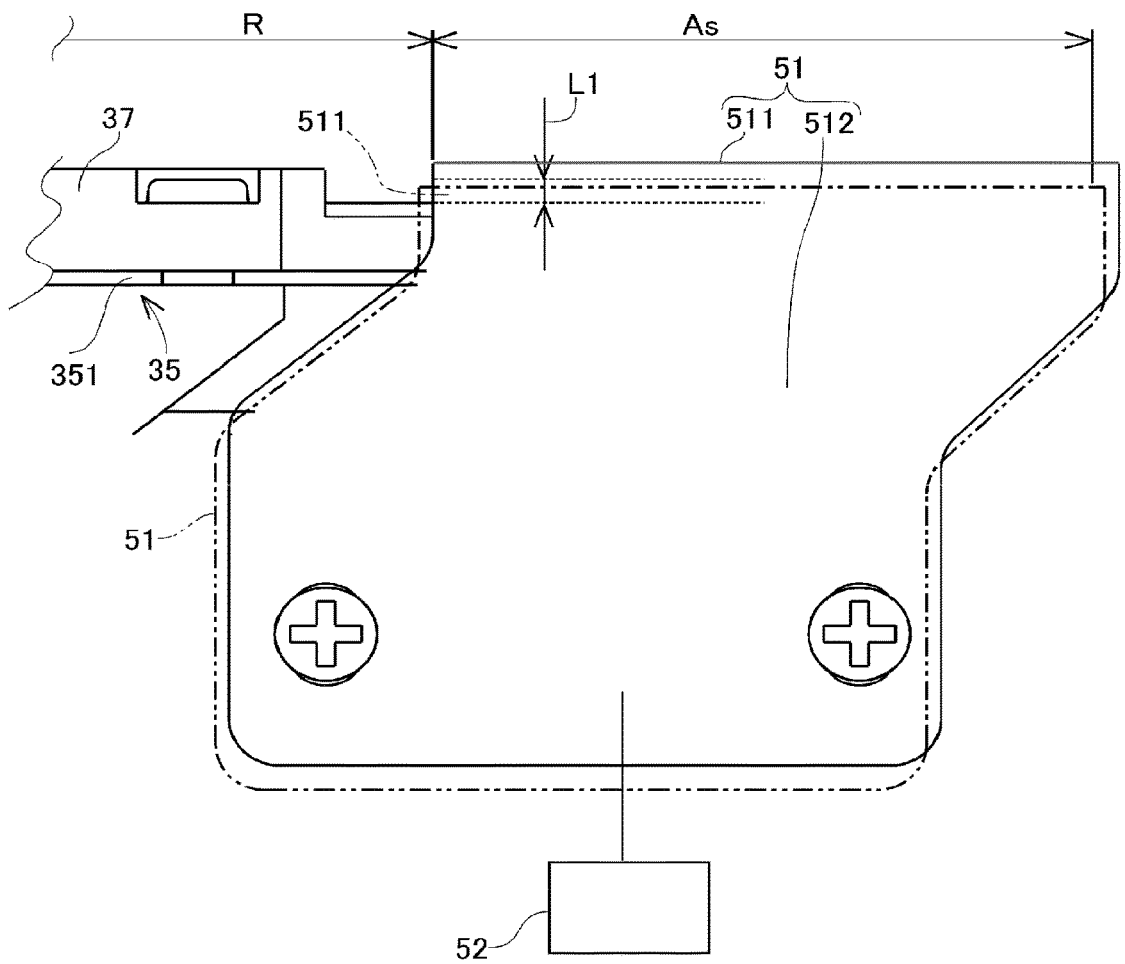

In addition, in driving device 52, a predetermined power is supplied to motor 525, so that arm 524 rotates by a certain angle from the initial angle, so that shutter 51 can be brought into an intermediate state. At this time, as illustrated in FIG. 7, shutter 51 moves slightly toward the front side and moves upward by lift amount L1. Lift amount L1 is set to be larger than the amplitude of the vibration of track member 35. As a result, shutter 51 in the intermediate state is maintained in a non-contact state with respect to the vibrating track member 35. It should be noted that FIG. 7 illustrates exaggerated lift amount L1 out of the movement amount of shutter 51 that has shifted from the closed state to the intermediate state.

In addition, it is preferable that lift amount L1 is set such that a gap formed between track member 35 and shutter 51 is smaller than a minimum dimension (for example, a thickness of component 92) in an outer shape of component 92. As a result, shutter 51 can surely prevent component 92 from protruding while being separated from track member 35 in the intermediate state.

3-3. Dock 53 and Opening/Closing Sensor 54

Dock 53 is a member that moves integrally with slider 522. As illustrated in FIGS. 5 and 6, dock 53 is fastened to slider 522 on one side (right side in the present embodiment) of left and right sides of feeder main body 31 by bolts. Opening/closing sensor 54 is a sensor for detecting the position of dock 53 when shutter 51 shifts to the open state. In the present embodiment, opening/closing sensor 54 is set to detect dock 53 when shutter 51 shifts to a completely open state.

In addition to the configuration described above, opening/closing sensor 54 may detect the position of dock 53 when shutter 51 is in the intermediate state. At this time, opening/closing sensor 54 may be provided at each of multiple positions of feeder main body 31 in accordance with the shape of dock 53 to separately detect the positions of dock 53 corresponding to the intermediate state and the open state of shutter 51. In addition, one opening/closing sensor 54 may detect the positions of dock 53 corresponding to both the intermediate state and the open state of shutter 51, respectively.

4. Feeder Control Device 70

Bulk feeder 30 includes feeder control device 70. Feeder control device 70 mainly includes a CPU, various memories, or a control circuit. Feeder control device 70 is powered via connector 311 in a state in which bulk feeder 30 is set in slot 121, and is placed in a state capable of communicating with control device 20 of component mounting machine 10.

As illustrated in FIG. 2, feeder control device 70 includes storage section 71. Storage section 71 includes a flash memory or the like. Storage section 71 stores various data such as a program and a conveyance parameter used for controlling the component supplying process. The above-mentioned "conveyance parameter" is a parameter for controlling the operation of excitation device 40 so that the vibration applied to track member 35 is appropriate when component 92 is conveyed in the component supplying process, and is set in advance in association with each type of component 92, for example.

Feeder control device 70 includes conveyance control section 72. The conveyance control section 72 controls the operation of excitation device 40 to execute the conveying operation of component 92. Specifically, the conveyance control section 72 sends a command to power supply device 44 of excitation device 40 when executing the conveying operation. As a result, when power supply device 44 supplies a predetermined power to piezoelectric element 42, vibration is applied to track member 35 via bracket 34. Then, component 92 on conveyance path R is conveyed by receiving an external force so as to move in the conveyance direction.

Feeder control device 70 includes drive control section 75 directed to shutter unit 50. Drive control section 75 controls the movement of slider 522 based on a result detected by opening/closing sensor 54. Drive control section 75, together with the conveyance control section 72, appropriately drives shutter unit 50 to switch the closed state, the intermediate state, and the open state of shutter 51 based on a command from control device 20 of component mounting machine 10.

5. Mounting Process and Feeder Control by Component Mounting Machine 10

As illustrated in FIG. 8, component mounting machine 10 performs feeder control according to the supply state by bulk feeder 30 during each period in the mounting process. Here, control device 20 performs calibration processing after bulk feeder 30 is set in slot 121, and recognizes the position of supply region As in the machine. Specifically, control device 20 first instructs feeder control device 70 to close shutter 51. As a result, drive control section 75 performs control such that the power supply to driving device 52 is interrupted and shutter 51 is closed. As a result, multiple reference marks 356 can be imaged from the upper side.

Control device 20 moves substrate camera 15 above multiple reference marks 356 of bulk feeder 30, and acquires image data by imaging of substrate camera 15. Then, control device 20 recognizes the position of bulk feeder 30 in the machine, that is, the position of supply region As, based on the positions of multiple reference marks 356 included in the image data by the image processing and the position of substrate camera 15 when the image is captured.

Subsequently, control device 20 instructs bulk feeder 30 to convey component 92 before collecting component 92 from bulk feeder 30 in the mounting process. As a result, bulk feeder 30 discharges component 92 from component case 32 as necessary and causes component 92 to flow to track member 35. Thereafter, bulk feeder 30 causes drive control section 75 to maintain shutter 51 in the intermediate state, thereby performing the conveying operation of component 92. As a result, component 92 is accommodated in multiple cavities 354, and the excess component 92 is retracted from supply region As to conveyance path R side.

When performing recognition processing of the supply state, control device 20 instructs bulk feeder 30 to open shutter 51. Control device 20 moves substrate camera 15 above supply region As, and acquires image data by imaging of substrate camera 15. State recognition section 22 of control device 20 recognizes the position and the angle of component 92 that can be collected by image processing for the image data as the supply state.

Control device 20 instructs bulk feeder 30 to open shutter 51 immediately before executing the collection operation in the PP cycle. In addition, control device 20 instructs bulk feeder 30 to close shutter 51 during a period in which the collection operation is completed and the mounting operation in the PP cycle is executed. It should be noted that, when the number of remaining components 92 that can be collected in supply region As is smaller than the number of components 92 that are to be collected in the collection operation of the next PP cycle, control device 20 instructs bulk feeder 30 to convey components 92 during the period in which the mounting operation is executed.

In other words, when instructed to convey component 92, bulk feeder 30 sets shutter 51 to the intermediate state and performs the above-described conveying operation. In addition, when the conveyance of component 92 is not instructed, bulk feeder 30 closes shutter 51 during the mounting operation. In either state, shutter 51 closes supply region As, so that component 92 is prevented from protruding and the foreign matters are prevented from entering supply region As.

When the mounting operation is completed, control device 20 shifts to the next PP cycle and collects component 92 from bulk feeder 30 again. Therefore, control device 20 instructs bulk feeder 30 to bring shutter 51 into the open state. Then, when the conveyance of component 92 is instructed, control device 20 executes the recognition processing of the supply state again. Meanwhile, when the conveyance of component 92 is not instructed, control device 20 omits the recognition processing of the supply state, and performs the collection operation for the remaining components 92 that can be collected based on the result of the previous recognition processing.

As described above, control device 20 sets shutter 51 to the open state during a period in which the camera (in the present embodiment, substrate camera 15) images supply region As and during a period in which component transfer device 13 collects component 92 from supply region As. In addition, control device 20 sets shutter 51 in the closed state (in a case where no conveyance is required) or the intermediate state (in a case where conveyance is required) during a period in which component 92 collected by component transfer device 13 is transferred to the substrate and a period in which bulk feeder 30 conveys multiple components 92.

6. Effects of Configuration of Embodiment

According to the configuration exemplified in the above embodiment, bulk feeder 30 can close the opening of supply region As by closing shutter 51, so that it is possible to prevent component 92 from protruding during conveyance and to prevent foreign matters from entering supply region As. In addition, since shutter 51 which shifts from the closed state to the open state is separated from track member 35 in which supply region As is formed, it is possible to prevent shutter 51 from affecting the vibration characteristics of track member 35. Accordingly, bulk feeder 30 can appropriately perform the conveying operation of component 92 using the vibration by releasing the closed state of the shutter.

7. Modification of Embodiment

7-1. Track Member 35

In the embodiment, track member 35 of bulk feeder 30 includes alignment member 353 having multiple cavities 354 formed therein. Meanwhile, a configuration may be adopted in which alignment member 353 is omitted. That is, in supply region As of track member 35, a recessed portion in which component 92 is dispersed at a position lower than the upper surface of conveyance path R, or a planar portion uniform with the upper surface of conveyance path R may be formed, so that component 92 is supplied in the bulk state. It should be noted that, from the viewpoint of improving the efficiency of the component supplying process or reducing the load of the image processing in the recognition processing of the supply state in supply region As, the configuration described in the embodiment is preferable.

7-2. Camera

In the embodiment, the camera for imaging supply region As of bulk feeder 30 is configured to be substrate camera 15. Meanwhile, component mounting machine 10 may include a camera provided above bulk feeder 30 and capable of imaging supply region As. The camera may be dedicated to imaging of supply region As or may also be used for other purposes. With such a configuration, the camera is configured to be fixed, so that it is possible to improve the accuracy of the calibration processing and the recognition processing of the supply state. However, the aspect exemplified in the embodiment is preferable from the viewpoint of reducing the facility cost.

REFERENCE SIGNS LIST

10: component mounting machine, 12: component supply device, 13: component transfer device. 15: substrate camera, 20: control device, 22: state recognition section, 30: bulk feeder, 31: feeder main body, 32: component case, 35: track member, 40: excitation device, 50: shutter unit, 51: shutter, 511: upper wall portion, 512: side wall portion, 52: driving device, 521: rail, 522: slider. 523: pin, 524: arm, 525: motor. 526: spring (elastic member), 53: dock, 54: opening/closing sensor, 70: feeder control device, 75: drive control section, 91: substrate, 92: component, As: supply region, R: conveyance path

The invention claimed is:

1. A bulk feeder comprising:
a feeder main body;
a track member provided to be vibratable with respect to the feeder main body and formed with a conveyance path through which multiple components are conveyed and a supply region that communicates with the conveyance path and opens upward to collect the multiple components;
an excitation device configured to apply vibration to the track member so that the multiple components are conveyed along the conveyance path;
a shutter provided above the track member to close an opening of the supply region;
a driving device configured to open or close the shutter to separate the shutter from the track member when the shutter shifts from a closed state to an open state; and
a slider configured to support the shutter and movable along a rail.

2. The bulk feeder according to claim 1, wherein the rail extends in a front-rear direction and an up-down direction of the feeder main body.

3. The bulk feeder according to claim 2, wherein the driving device further includes
a pin extending in a width direction of the feeder main body and locking in the front-rear direction with respect to the slider,
an arm configured to support the pin and provided to be rotatable about a horizontal axis extending in the width direction with respect to the feeder main body,
a motor configured to rotate the arm, and
an elastic member configured to connect the feeder main body and the slider and bias the slider to a lower end side in the rail.

4. The bulk feeder according to claim 2, further comprising:
a dock moving integrally with the slider;
a sensor configured to detect a position of the dock when the shutter shifts to the open state; and
a drive control section configured to control a movement of the slider based on a result detected by the sensor.

5. A bulk feeder comprising:
a feeder main body:
a track member provided to be vibratable with respect to the feeder main body and formed with a conveyance path through which multiple components are conveyed and a supply region that communicates with the conveyance path and opens upward to collect the multiple components;
an excitation device configured to apply vibration to the track member so that the multiple components are conveyed along the conveyance path:
a shutter provided above the track member to close an opening of the supply region; and
a driving device configured to open or close the shutter to separate the shutter from the track member when the shutter shifts from a closed state to an open state,
wherein an opening/closing operation of the shutter includes an intermediate state which is a state between the closed state and the open state, and in the intermediate state, the shutter is separated from the track member by at least an amplitude of the track member vibrated by excitation of the excitation device and restricts protruding of a component from the opening of the supply region.

6. The bulk feeder according to claim 5, wherein the shutter includes
an upper wall portion which comes into contact with the track member in the closed state to close the opening of the supply region and is separated from the track member in the intermediate state, and
a pair of side wall portions which is located outside the track member in a width direction and extends downward from both end edges of the upper wall portion to restrict protruding of the component from the opening of the supply region together with the upper wall portion in the intermediate state.

7. The bulk feeder according to claim 5, wherein the shutter is brought into the open state when the bulk feeder supplies the multiple components, and is brought into the intermediate state when the excitation device applies vibration to the track member.

8. A component mounting machine comprising:
a component supply device provided with the bulk feeder according to claim 1; and
a control device configured to control a supply operation of the components by the bulk feeder and an opening/closing operation of the shutter.

9. The component mounting machine according to claim 8, wherein the opening/closing operation of the shutter includes an intermediate state which is a state between the closed state and the open state, and in the intermediate state, the shutter is separated from the track member by at least an amplitude of the track member vibrated by excitation of the excitation device and restricts protruding of the component from the opening of the supply region, the component mounting machine further comprises a component transfer device configured to transfer the components supplied by the component supply device to a substrate, a camera configured to image the supply region, and a state recognition section configured to recognize a supply state of the multiple components in the supply region based on image data acquired by imaging of the camera, and the control device sets the shutter to the open state during a period in which the camera images the supply region and a period in which the component transfer device collects the component from the supply region, and the shutter to the closed state or the intermediate state during a period in which the component collected by the component transfer device is transferred to the substrate and a period in which the bulk feeder conveys the multiple components.

* * * * *